(12) United States Patent
Breen et al.

(10) Patent No.: US 6,866,791 B1
(45) Date of Patent: Mar. 15, 2005

(54) METHOD OF FORMING PATTERNED NICKEL AND DOPED NICKEL FILMS VIA MICROCONTACT PRINTING AND USES THEREOF

(75) Inventors: Tricia L. Breen, Tarrytown; Peter M. Fryer, Yorktown Heights, both of NY (US); Robert L. Wisnieff, Ridgefield, CT (US); John Christopher Flake, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/562,681

(22) Filed: May 2, 2000

(51) Int. Cl.[7] .............................. B44C 1/22; C23F 1/00
(52) U.S. Cl. ........................... 216/41; 216/49; 216/100; 438/754
(58) Field of Search .................................. 438/689, 745, 438/754; 216/12, 41, 45, 49, 100, 102, 105

(56) References Cited

U.S. PATENT DOCUMENTS 5,725,788 A * 3/1998 Maracas et al. .............. 216/41
5,900,160 A * 5/1999 Whitesides et al. ........... 216/41

* cited by examiner

*Primary Examiner*—William A. Powell
(74) *Attorney, Agent, or Firm*—Thomas A. Beck; Daniel P. Morris

(57) ABSTRACT

The process of derivatization and patterning of surfaces, and more particularly to the formation of self-assembled molecular monolayers on metal oxide surfaces using microcontact printing and the derivative articles produced thereby.

28 Claims, 3 Drawing Sheets

METHOD OF FORMING PATTERNED NICKEL AND DOPED NICKEL FILMS VIA MICROCONTACT PRINTING AND USES THEREOF

FIELD OF THE INVENTION

The present invention relates generally to derivatization and patterning of surfaces, and more particularly to the formation of self-assembled molecular monolayers on metal oxide surfaces using microcontact printing and derivative articles produced thereby.

BACKGROUND

In the field of microelectronic devices, sensors, optical elements and electronic displays, the development of devices that are conveniently and relatively inexpensively produced with a relatively low failure rate is important.

A well-known method of production of such devices is photolithography. According to this technique, a negative or positive resist (photoresist) is coated onto the exposed surface of a substrate. The resist is then irradiated in a predetermined pattern, and irradiated (positive resist) or non irradiated (negative resist) portions of the resist are washed from the surface to produce a predetermined pattern of resist on the surface. This is followed by one or more procedures. For example, the resist may serve as a mask in an etching process in which areas of the material not covered by resist are chemically removed, followed by removal of resist to expose a predetermined pattern of the conducting, insulating, or semiconducting material on the substrate.

According to another example, the patterned surface is exposed to a plating medium or to metal deposition (for example under vacuum), followed by removal of resist, resulting in a predetermined plated pattern on the surface of the material. In addition to photolithography, x-ray and electron-beam lithography have found analogous use.

While the above-described irradiative lithographic methods may be advantageous in many circumstances, all require relatively sophisticated and expensive apparatus to reproduce a particular pattern on a plurality of substrates. Additionally, they generally consume more reactants and produce more by-products in collateral fabrication steps than is optimal. Further, they are relatively time-consuming.

A need exists in the art for a convenient, inexpensive, and reproducible method of etching a surface according to a predetermined pattern. The method would ideally result in patterns having features in the micron and submicron domain, and would provide for convenient reproduction of existing patterns.

The study of self-assembled monolayers (SAMs) is an area of significant scientific research. Such monolayers are typically formed of molecules each having a functional group that selectively attaches to a peculiar surface, the remainder of each molecule interacting with neighboring molecules in the monolayer to form a relatively ordered array. Such SAMs have been formed on a variety of substrates including metals, silicon dioxide, gallium arsenide, and others. SAMs have been applied to surfaces in predetermined patterns in a variety of ways including simple flooding of a surface and more sophisticated methods such as irradiative patterning and microcontact printing.

An example of a SAM that has been extensively studied and has been the subject of several patents is composed of a molecular species having a long-chain alkyl group and a thiol (—SH) group at one terminus. These SAMs are formed on metallic surfaces like gold, silver, copper, etc. For example, U.S. Pat. No. 5,512,131 to Kumar et al., describes patterned transfer of alkyl thiols to metallic surfaces such as gold. Other molecular species capable of forming SAMs on oxide surfaces usually contain, at one terminus, trichloro or trialkoxy silane groups that form covalent bonds with hydroxylated surfaces of metal oxides. The drawback of using silane-containing compounds is that these materials are very reactive, forming crosslinked structures in solution or on the surface of a stamp used for microcontact printing. Trichlorosilanes must be handled under an inert atmosphere to prevent their decomposition.

A general description of patterning is found in U.S. Pat. No. 5,900,160 to Whitesides et al. relating to methods of etching articles via microcontact printing.

Accordingly, a general purpose of the present invention is to solve problems associated with expense, complicated apparatus, and other complications associated with patterning nickel and doped nickel films for optical and electronic devices.

One object is to provide a method of conveniently and reproducibly producing a variety of SAM patterns on nickel oxide surfaces such as the native oxide surfaces of nickel and doped nickel films, the pattern having resolution in the micron domain, and being amenable to etching.

Another object of the invention is to selectively remove by etching, areas of the nickel oxide and underlying metal that are not covered and protected by the SAM.

As used herein in the description of the present invention, the expression "nickel oxide" shall mean and include native nickel oxide as well as nickel oxide which has been grown or deposited on nickel or other metal films.

Another general purpose of the invention is to provide electronic and optical elements and devices that are conveniently and inexpensively manufactured, and that are adaptable to a variety of systems.

SUMMARY

The method of patterning a nickel oxide or doped nickel oxide surface comprising the present invention, involves the steps of:

a) providing a solid substrate which may be a silicon wafer, glass, quartz, or polymeric materials such as polyimide, polyacrylate, and polyester coated with a metal film, (i.e., from about 5 to about 1000 nm) preferably nickel, which as noted includes nickel doped with phosphorus, boron and/or tungsten Alternatively metal films made of copper, zinc and aluminum may be used; there is a layer of native, grown or deposited nickel oxide placed on said metal film;

b) providing a stamp having a substantially continuous surface with at least one indentation, said indentation being formed by indenting means;

c) coating said stamp surface with a molecular species terminating in a functional group which is capable of reacting with said nickel oxide surface to form a bond between said functional group and said nickel oxide surface;

d) positioning said coated stamp on the surface of said nickel oxide such that said functional group contacts and reacts with at least a portion of the nickel oxide surface to form a bond therebetween;

e) removing said stamp from the surface of the nickel oxide to obtain a self-assembled monolayer comprising the reaction product of said functional group of said molecular species and said nickel oxide.

The non-contacted portion of said nickel oxide surface which is not reacted with said molecular species and the metal film under the non-contacted portion are removed by contact with an etchant.

The molecular species used in according with the present invention is an organic compound consisting of an alkyl group terminating with a phosphonic acid group and has the formula [$CH_3(CH_2)_nPO_3H_2$], wherein in the alkyl portion, n=5–21.

Alternatively, the molecular species comprises an organic compound consisting of an alkyl group which is fully or partially fluorinated terminating with a phosphonic acid group and has the formula [$CF_3(CF_2)_m(CH_2)$—$PO_3H_2$], where n=0–20 and n+m=5–20.

The present invention provides a method of forming a patterned film of metals, preferably nickel or doped nickel, covered with a layer of nickel oxide, by microcontact printing and etching. The method involves contacting the nickel oxide surface covering the metal film with a stamp to transfer to it a self-assembled monolayer of a molecular species in a pattern. The self-assembled monolayer is contiguous with an exposed portion of the surface of the nickel oxide layer in a second pattern. The nickel oxide layer and underlying metal film are removed from the underlying substrate, according to the second pattern, by contacting the exposed portion of the nickel oxide layer and underlying metal film with one or more etchants that react(s) chemically with the nickel oxide and underlying metal and which are inert with respect to the self-assembled monolayer.

Figure 1A:
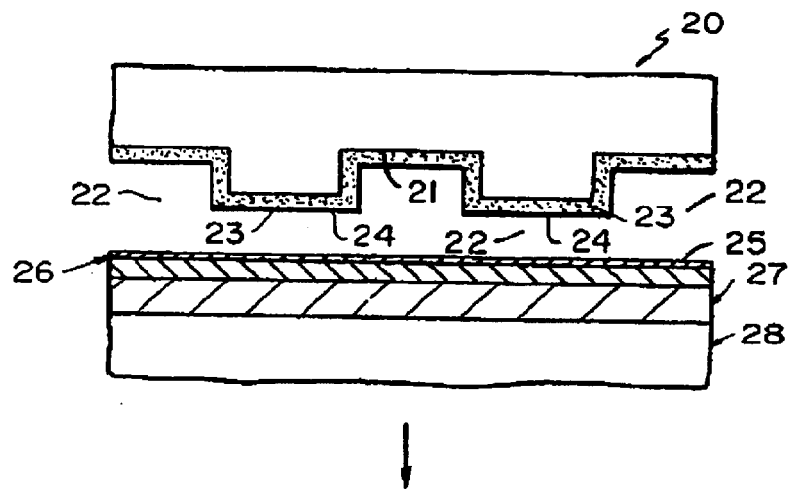
FIGS. 1a–e illustrate microcontact printing of a self-assembled molecular monolayer on the surface of a film of nickel oxide on a metal film on a substrate.

The various features of novelty which characterize the invention are pointed out with particularity in the claims annexed to and forming a part of the disclosure. For a better understanding of the invention, its operating advantages and specific objects attained by its use, reference should be had to the drawings and descriptive matter which are illustrated and described in the preferred embodiments of the invention.

DETAILED DESCRIPTION OF THE PREFERRED EMBODIMENT

Referring to FIGS. 1a–e, a method for forming a patterned film of nickel covered with a film of native or grown nickel oxide that uses microcontact printing is illustrated schematically. At FIG. 1a, a stamp 20 is illustrated having a surface 21 including a plurality of indentations 22 formed therein that form an indentation pattern. The indentations are contiguous with a stamping surface 23 that defines a stamping pattern.

Prior to microprinting, stamping surface 23, typically the entire surface 21 of the stamp, is coated with a molecular species 24. Molecular species 24 terminates in a phosphonic acid functional group, selected to bind to the nickel oxide surface and to form a self-assembled monolayer thereupon. Referring to FIGS. 1a–e, the phosphonic acid functional group at the terminus of species 24 is selected to bind to surface 25 of material 26 (nickel oxide) on metal film 27 provided on site 28, and to form a self-assembled monolayer on surface 25.

Figure 1B:
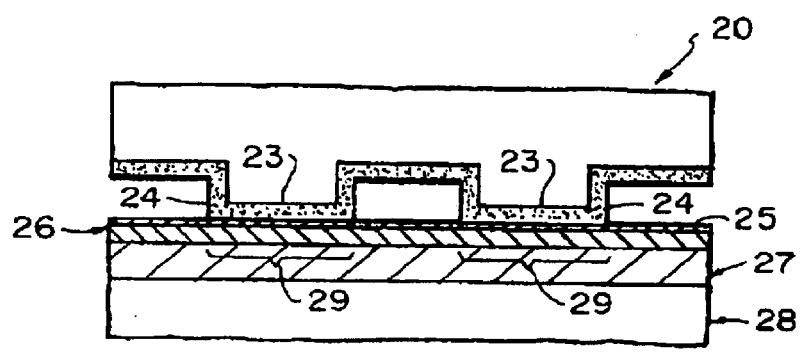

Referring to FIG. 1b, stamp 20 is placed, in a predetermined orientation, adjacent to substrate 28 such that stamping surface 23 contacts first portions 29 of article surface 25. Stamping surface 23 is held against portions of surface 25 of material 26 to hold molecular species 24 against the material surface to allow the phosphonic acid group to bind thereto.

Figure 1C:
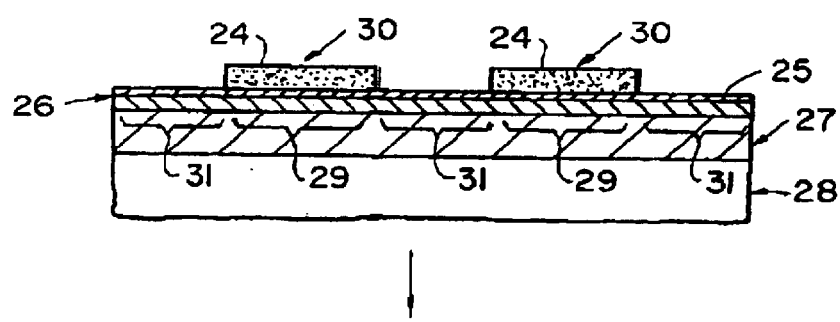

In FIG. 1c, stamp 20 has been removed from surface 25 to provide SAM 30 of the molecular species 24 on surface 25 according to the stamping pattern of stamping surface 23. Second portions 31 of surface 25, contiguous with first portions 29, remain free of molecular species 24.

Figure 1D:
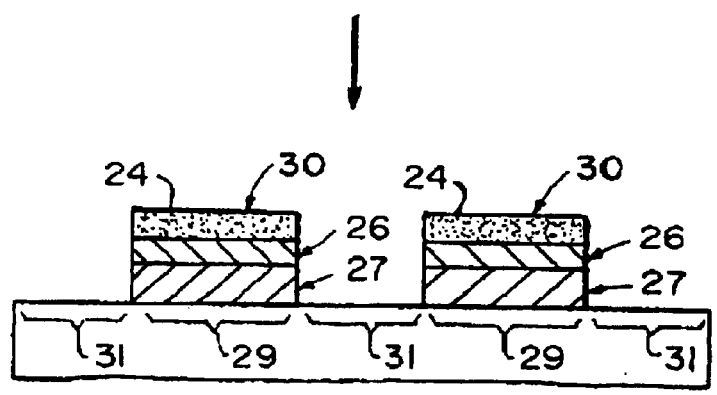
Figure 1E:

After removal of stamp 20, an etchant is applied to the surface. Species 24 is undisturbed by the etchant, and therefore the etchant does not attack the area of surface 25 that is covered by species 24. The etchant contacts surface 25 of material 26 on metal 27 on substrate 28 via gap 31, and dissolves material 26 and metal 27 at gap 31. The pattern of stamping surface 23 is thus transferred to the film of material 26 and underlying metal 27. The result is illustrated in FIG. 1d. A electron micrograph of metal 27 (boron-doped nickel) covered with native nickel oxide 26 on glass substrate 28 that has been patterned according to the embodiment illustrated is shown in FIG. 1e.

The above described procedure can be applied to films of nickel oxide deposited on metals other than nickel such as copper, zinc, aluminum, etc. In this case, a second etchant which selectively removes metal 27 and leaves either species 24 or nickel oxide 26 undisturbed, can be used after oxide 26 is removed using the first etchant as described above. The second etchant is chosen in such a way that either molecular species 24 or nickel oxide 26 is left undisturbed by this second etchant and thus acts as an etch resist for metal film 27.

Molecular species 24 may be coated onto stamping surface 23 by any convenient method, for example, molecular species 24 may be sprayed onto stamping surface 23. Alternatively, a cotton swab or the like may be used to transfer molecular species 24 to stamping surface 23, or molecular species 24 may be absorbed into a piece of paper, and stamping surface 23 may then be pressed against the piece of paper.

Generally, molecular species 24 is dissolved in a solvent for transfer to stamping surface 23. The concentration of molecular species 24 in such a solvent for transfer should be selected to be low enough that a well-defined SAM may be transferred to surface 25 without blurring, and high enough that the SAM protects underlying surface 25 from the etchant. Typically, species 24 will be transferred to stamping surface 23 in a solvent at a concentration of less than 100 mM, preferably from about 0.5 to about 20.0 mM, and more preferably from about 1.0 to about 10.0 mM. Any organic solvent within which molecular species 24 dissolves is suitable. When molecular species 24 is transferred to stamping surface 23, either near or in a solvent, the stamping surface should be dried before the stamping process is carried out. If stamping surface 23 is not dry when the SAM is stamped onto the material surface, that is, if gross liquid remains on the stamping surface, blurring of the SAM will result from dispersion of the liquid from under the stamping surface. Stamping surface 23 may be air dried, blow dried, or dried in any other convenient manner. The drying manner should simply be selected so as not to degrade the SAM-forming molecular species.

The film of material 27 is deposited, by any convenient method such as deposition in an electroless plating bath, electroplating or sputtering, on any convenient substrate, for example, silicon, silicon dioxide etc. The thickness of the film of material 27 is typically less than 1000 nm, preferably from about 25 to about 500 nm, and more preferably from about 50 to about 100 nm.

The film of nickel oxide 26 is either the native oxide of nickel film 27, or is grown on nickel film 27 by any convenient method, such as thermal electrochemical or chemical oxidation, or oxidation using reactive gases or plasma sources. The film of nickel oxide 26 may also be deposited on other metals 27, such as zinc, copper, aluminum, etc., by any convenient method such as sputtering.

According to another embodiment of the invention, SAM 30 is formed over the entirety of surface 25. For example, SAM 30 may be formed by immersing surface 25 in a solution of molecular species 24. Alternatively, a stamp in which stamp surface 21 does not include any indentations may be used in a microcontact printing process as in FIG. 1.

The function and advantage of these and other embodiments of the present invention will be more fully understood from the examples below. The following examples are intended to illustrate the benefits of the present invention, but do not exemplify the full scope of the invention.

EXAMPLE 1
Fabrication of a Microcontact Printing Stamp

A template consisting of an exposed and developed photoresist pattern was fabricated by photolithography. A 2-mm-high border was formed by fixing strips of 2-mm-thick adhesive-backed foam around the perimeter of the surface of the template. A 10:1 (w:w or v:v) mixture of PDMS-Sylgard Silicone Elastomer 184 and Sylgard Curing Agent 184 (Dow Corning Corp., Midland, Mich.) was degassed under vacuum for about 10 minutes, then the mixture was poured over the template to approximately the height of the foam border. The PDMS cured at 65° C. for 60 minutes. After cooling to room temperature, the PDMS-stamp was carefully peeled from the template.

Figure 2A:
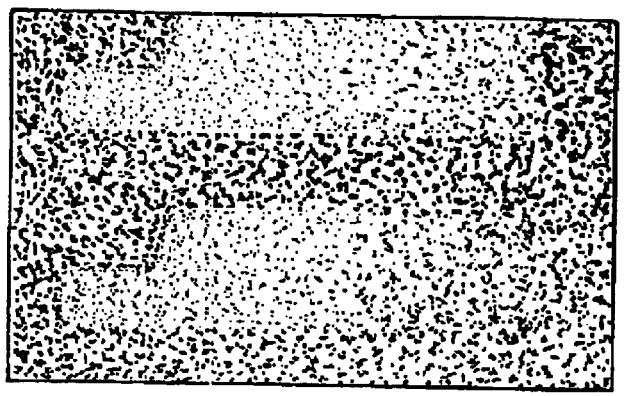
FIGS. 2a–b illustrate boron-doped nickel film covered with a layer of native nickel oxide, derivatized using the technique illustrated in FIGS. 1a–e.
Figure 2B:

EXAMPLE 2
Patterning Boron-Doped Nickel Films by Microcontact Printing and Wet Etching A stamp fabricated in accordance with Example 1 was fabricated. The surface was coated with octadecylphosphonic acid in ethanol by applying a small volume of solution to cover the surface of the stamp. After allowing the solution to contact the surface of the stamp for 30s, the stamp surface was dried under a stream of dry dinitrogen. The stamp was applied to the native nickel oxide surface of a boron-doped nickel film and removed, whereby a pattern of alkanephosphonic acid is formed. The remaining unprotected native nickel oxide layer and boron-doped nickel film was removed from the surface of the silicon substrate using an aqueous hydrochloric acid (8.0 mM) and hydrogen peroxide (0.6% v:v) solution, thus transferring the pattern of the stamp to the native nickel oxide layer and boron-doped nickel film. An optical micrograph of the resultant pattern is shown in FIG. 2a and a scanning electron micrograph in FIG. 2b.

Thus while there have been shown and described and pointed out fundamental novel features of the invention as applied to currently preferred embodiments thereof, it will be understood that various omissions and substitutions and changes in the form and details of the method and apparatus illustrated, and in their operation, may be made by those skilled in the art without departing from the spirit of the invention. In addition, it is to be understood that the drawings are not necessarily drawn to scale but that they are merely conceptual in nature. It is the intention, therefore, to be limited only as indicated by the scope of the claims.

What we claim and desire to protect by Letters Patent is:

1. A method of patterning a nickel oxide surface, comprising the steps of:
    a) providing a substrate coated with a metal film, said metal film coated with a layer of native, grown or deposited nickel oxide;
    b) providing a stamp having a substantially continuous surface with at least one indentation;
    c) coating said stamp surface with a molecular species terminating in a functional group which is capable of reacting with said nickel oxide surface to form a bond between said functional group and said nickel oxide surface;
    d) positioning said coated stamp on the surface of said nickel oxide such that said functional group contacts and reacts with at least a portion of said nickel oxide surface to form a bond therebetween;
    e) removing said stamp from the surface of said nickel oxide to obtain a self-assembled monolayer comprising the reaction product of said functional group of said molecular species and said nickel oxide.

2. The method defined in claim 1 wherein said molecular species terminating in a functional group which is capable of reacting with said nickel oxide surface to form a bond between said functional group and said nickel oxide surface is dissolved in a solvent which is used to coat said stamp surface.

3. The method defined in claim 1 wherein the non-contacted portion of said nickel oxide surface which is not reacted with said molecular species, and said metal film under said non-contacted portion are removed by contact with an etchant.

4. The method defined in claim 1 wherein said molecular species comprises an alkyl group terminating with a phosphonic acid group and has the formula $[CH_3(CH_2)_n PO_3H_2]$, wherein in the alkyl portion, n=5–21.

5. The method defined in claim 1, wherein said molecular species comprises an alkyl group which is fully or partially fluorinated terminating with a phosphonic acid group and has the formula $[CF_3(CF_2)_m(CH_2)_n—PO_3H_2]$, where n=0–20 and n+m=5–20.

6. A method defined in claim 1 wherein said substrate is selected from the group consisting of silicon wafer, glass, quartz, polyimide, polyacrylate, and polyester.

7. The method defined in claim 1, wherein said metal film is nickel and said layer coating said metal film is native nickel oxide.

8. The method defined in claim 1, wherein said metal film is nickel and said layer coating said metal film is nickel oxide which has been grown on said metal film thermally, electrochemically, chemically or using reactive gases, plasma gases.

9. The method defined in claim 7 wherein the thickness of said metal film is between about 5 and about 1000 nm.

10. The method defined in claim 1, wherein said metal film is selected from the group consisting of nickel, copper, zinc, aluminum, and said layer coating on said metal film is nickel oxide which has been applied by sputtering.

11. The method defined in claim 7 wherein the thickness of said nickel oxide layer is 50–1000 nm.

12. The method defined in claim 7 wherein said metal film is deposited by means of vacuum evaporation, sputtermg, electroless plating or electroplating.

13. A method defined in claim 7 wherein the surface of said nickel film is doped with elements selected from the group consisting of phosphorus, boron, and tungsten.

14. The method defined in claim 4 wherein said metal is selected from the group consisting of nickel, copper, zinc, aluminum, and is patterned using the following steps:
   a) positioning said stamp coated with said molecular species on the surface of said nickel oxide and then contacting selected portions of said nickel oxide to allow said portions to react with said molecular species;
   b) removing said stamp from the surface of said nickel oxide to obtain a self-assembled monolayer comprising the reaction product of said functional group of said molecular species and said nickel oxide surface;
   c) removing with an etchant the non-contacted portions of nickel oxide which is not reacted with said bound molecular species, to form patterns of said nickel oxide on said substrate;
   d) removing with an etchant the exposed metal.

15. The method defined in claim 14 in which the patterned substrate is used in the fabrication of optoelectronic devices.

16. The method defined in claim 15 wherein said optoelectronic device is a liquid crystal display.

17. The method defined in claim 14 wherein said indentation is formed by means selected from the group consisting of lithographic, x-ray and electron-beam lithography.

18. The method defined in claim 2 wherein the concentration of said molecular species terminating in a functional group which is capable of reacting with said nickel oxide surface to form a bond between said functional group and said nickel oxide surface dissolved in said solvent is less than 100 mM.

19. The method defined in claim 18, wherein the concentration of said molecular species in said solvent is between about 0.5 mM and about 20 mM.

20. The method defined in claim 19, wherein the concentration of said molecular species in said solvent is between about 1.0 mM and about 10 mM.

21. The method defined in claim 8 wherein the thickness of said metal film is between about 5 and about 1000 nm.

22. The method defined in claim 10 wherein the thickness of said metal film is between about 5 and about 1000 nm.

23. The method defined in claim 8 wherein the thickness of said nickel oxide layer is 50–1000 nm.

24. The method defined in claim 10 wherein the thickness of said nickel oxide layer is 50–1000 nm.

25. The method defined in claim 8 wherein said metal film is deposited by means of vacuum evaporation, sputtering, electroless plating or electroplating.

26. The method defined in claim 8 wherein said metal film is deposited by means of vacuum evaporation, sputtering, electroless plating or electroplating.

27. A method defined in claim 8 wherein the surface of said nickel film is doped with elements selected from the group consisting of phosphorus, boron, and tungsten.

28. A method defined in claim 10 wherein the surface of said nickel film is doped with elements selected from the group consisting of phosphorus, boron, and tungsten.

* * * * *